United States Patent
Dydyk

[19]

[11] Patent Number: 5,884,378
[45] Date of Patent: Mar. 23, 1999

[54] METHOD OF MAKING AN ENHANCED QUALITY FACTOR RESONATOR

[75] Inventor: Michael Dydyk, Scottsdale, Ariz.

[73] Assignee: Motorola, Inc., Schaumburg, Ill.

[21] Appl. No.: 684,777

[22] Filed: Jul. 22, 1996

Related U.S. Application Data

[62] Division of Ser. No. 496,780, Jun. 29, 1995, Pat. No. 5,596,239.

[51] Int. Cl.$^6$ ..................................................... H01L 41/22
[52] U.S. Cl. .......................... 29/25.35; 310/311; 310/324
[58] Field of Search ............................ 29/25.35; 310/311, 310/324, 348, 349, 365

[56] References Cited

U.S. PATENT DOCUMENTS

| | | | |
|---|---|---|---|
| 2,266,070 | 12/1941 | Pierce | 310/349 |
| 2,807,731 | 9/1957 | Minnich | 310/348 |
| 3,313,959 | 4/1967 | Dill | 307/88.5 |
| 3,414,832 | 12/1968 | Newell | 330/31 |
| 4,166,967 | 9/1979 | Benes et al. | 310/338 |
| 4,456,850 | 6/1984 | Inoue et al. | 310/324 |
| 4,502,932 | 3/1985 | Kline et al. | 204/192 |
| 4,556,812 | 12/1985 | Kline et al. | 310/324 |
| 4,616,152 | 10/1986 | Saito et al. | 310/324 |
| 4,640,756 | 2/1987 | Wang et al. | 204/192.18 |
| 4,642,508 | 2/1987 | Suzuki et al. | 310/321 |
| 4,672,591 | 6/1987 | Breimesser et al. | 367/152 |
| 4,719,383 | 1/1988 | Wang et al. | 310/324 |
| 4,749,900 | 6/1988 | Hadimioglu et al. | 310/334 |
| 5,011,568 | 4/1991 | Braymen et al. | 156/647 |
| 5,075,641 | 12/1991 | Weber et al. | 331/108 |
| 5,162,691 | 11/1992 | Mariani et al. | 310/321 |
| 5,198,716 | 3/1993 | Godshall et al. | 310/349 |
| 5,373,268 | 12/1994 | Dworsky et al. | 333/187 |

FOREIGN PATENT DOCUMENTS

| | | | |
|---|---|---|---|
| 5719114 | 8/1983 | Japan . | |
| 0980252 | 12/1984 | Japan | 310/349 |
| 0072277 | 4/1985 | Japan | 310/324 |
| 0041215 | 2/1986 | Japan | 310/349 |

OTHER PUBLICATIONS

"Face–Mounted Piezoelectric Resonators", by W.E. Newell, Senior Member, IEEE, 1965.

"Performance of Single–Crystal LiNbO$_3$ Transducers Operating Above 1 GHz" by Naoya Uchida, Syuzo Fukunishi and Shoichi Saito From IEEE 1973.

"Fabrication of Wideband Bragg Cells Using Thermocompression Bonding and Ion Beam Milling" by Joel Rosenaum, Michael G. Price, Rob Bonney and Otis G. Zehl, Members of IEEE, and from IEEE, 1985.

"Ultrasonically Welded Piezolectric Transducers" by John D. Larson, III and D.K. Winslow, Members of IEEE, from IEEE 1971.

*Primary Examiner*—Carl E. Hall
*Attorney, Agent, or Firm*—Frederick M. Fliegel; Frank J. Bogacz

[57] ABSTRACT

A high quality factor resonator (15) including a substrate (110) and a resonator layer (150). The resonator layer includes a first electrode (157). The resonator layer (150) is disposed on a surface of the substrate (110). The first electrode (157) is disposed on a distal surface of the resonator layer (150). A cavity (120) is disposed between the substrate (110) and the resonator layer (150) and a second electrode (159) is disposed on the substrate (110) and on a surface of the cavity (120) remote from the resonator layer (150) and is separated from the resonator layer (150) by a thin gap.

9 Claims, 2 Drawing Sheets

METHOD OF MAKING AN ENHANCED QUALITY FACTOR RESONATOR

CROSS-REFERENCE TO RELATED APPLICATIONS

This is a division of application Ser. No. 08/496,780, filed Jun. 29, 1995, now U.S. Pat. No. 5,596,239.

This application is related to U.S. Pat. Nos. 5,617,065 and 5,696,423 filed on an even date herewith and which are assigned to the same assignee as the present application.

FIELD OF THE INVENTION

This invention relates in general to the field of frequency selection components, in particular to bulk acoustic wave frequency selection components and more particularly to an improved quality factor acoustic wave frequency selection component.

BACKGROUND OF THE INVENTION

Frequency selective components are important for many electronic products requiring stable frequency signals or ability to discriminate between signals based on frequency diversity. These functions are difficult to reliably and repeatably realize in monolithic form together with other microelectronic components such as transistors, diodes and the like.

One approach to realizing frequency selective functions employs a mass allowed to vibrate in one or more dimensions (e.g., a pendulum). Such a mass is conveniently realized as a thin membrane supported at critical points, for example, peripherally or alternatively along one edge or end, forming a thin resonator structure. Such structures provide clearly defined mechanical resonances having significant utility, for example, as filters and as frequency stabilizing feedback elements in oscillator circuits. These structures have the advantages of being extremely compact and of providing narrow bandwidth (i.e., high quality factor) frequency selection components that are light weight and which do not require adjustment over the life of the component.

Thin film resonators incorporate a thin film, free-standing membrane. Typically, this is effected by forming a sacrificial layer followed by deposition of the membrane. The sacrificial layer is then selectively removed, leaving a self-supporting layer.

An alternative approach involves forming a cantilevered beam capacitively coupled to adjacent structures (e.g., a conductor placed beneath the beam). The beam is free to vibrate and has one or more resonance frequencies. Disadvantages of these approaches include need to form free-standing structures and also a tendency of the beam to "stick" to adjacent structures if or when the beam comes into contact therewith.

Problems encountered with such devices include reduced Q or quality factor due to at least two causes: (i) reduced quality factor of materials employed for the piezoelectric element and (ii) reduced quality factor for the composite resonator owing to the contributions of the metallizations forming the electrodes. Additionally, higher coupling piezoelectric materials (e.g., $LiNbO_3$, $LiTaO_3$, lithium tetraborate, $AlPO_4$, $BiGeO_{20}$, $BiSiO_{20}$ and the like) are preferred for some applications but tend to be more difficult to realize in thin film form, especially as oriented films exhibiting significant piezoelectricity.

The Q of the material(s) employed in the resonator may preclude providing the required bandwidth and insertion loss in the completed structure. Generally, narrow bandwidths require high Q materials. Deposited thin-film layers of piezoelectric materials tend to have poorer (i.e., lower) quality factors than the same materials prepared by other techniques (e.g., single-crystal materials) and this may limit the achievable bandwidth. Additionally, employing lossy materials for electrodes (e.g., Au, Ag, Pb etc.) reduces the overall Q of the resonator structure while use of low acoustic loss materials (e.g., Al and alloys thereof) has less of an adverse impact on the Q of the resonator structure. Accordingly, the bandwidth requirements for some applications may preclude use of some materials in the resonator and may require the use of other materials or particular material preparation techniques.

Many applications require robust, light-weight devices to be realized in small form factor and to consume as little electrical power as possible while operating over a broad range of temperatures. For example, satellite communications apparatus have stringent power requirements and also must operate over a broad temperature range. This example also places a premium on size, weight and reliability.

What are needed are apparatus and methods for forming apparatus wherein the apparatus provides a small, light-weight and robust resonator having solid mechanical support and including high quality factor, narrow-bandwidth frequency selection characteristics together with low power consumption requirements and low insertion loss.

SUMMARY OF THE INVENTION

A high quality factor resonator includes a substrate having a surface and a resonator layer including a first electrode. The resonator layer desirably comprises a single-crystal material and is disposed on the surface. The first electrode is disposed on a distal surface of the resonator layer. The resonator also includes a cavity disposed between the substrate and the resonator layer and a second electrode disposed on the substrate and on a surface of the cavity remote from the resonator layer, wherein the second electrode is separated from the resonator layer by a thin gap.

The resonator layer usefully comprises lithium niobate, lithium tantalate or lithium tetraborate and preferably comprises single-crystal lithium niobate, lithium tantalate or lithium tetraborate. In a preferred embodiment, the first electrode includes aluminum and desirably is circular. The second electrode optionally comprises gold.

The substrate usefully includes a semiconductor substrate comprising an integrated circuit. In one preferred embodiment, the resonator layer is welded to the substrate.

A method for manufacturing a high quality factor resonator usefully includes steps of providing a substrate, providing a resonator layer having substantially parallel first and second surfaces and coupling the resonator layer to the substrate such that the resonator layer is disposed atop the substrate and including a cavity disposed between the second surface of the resonator layer and the substrate.

The method desirably further includes a step of disposing a first electrode having a periphery on the first surface of the resonator layer, wherein the periphery is disposed over the cavity and within a periphery of the cavity and the first surface is more remote from the substrate than the second surface.

The coupling step desirably but not essentially includes a step of providing a second electrode contained within the cavity. The second electrode is disposed parallel to the second surface and separated therefrom by a gap having a width in a range of from 0.05 micrometers to about one micrometer.

The step of providing a substrate preferably includes a step of providing a semiconductor substrate including integrated circuitry. The step of providing a resonator layer preferably includes a step of providing a resonator layer comprising single-crystal material. The step of providing a resonator layer usefully includes a step of providing a resonator layer comprising material chosen from the group consisting of lithium niobate, lithium tantalate and lithium tetraborate.

In a first preferred embodiment, the coupling step includes steps of disposing metal on a portion of the second surface of the resonator layer, disposing metal on a portion of the substrate, aligning the metal on the portion of the second surface with the metal on the portion of the substrate and welding the resonator layer to the substrate. The welding step desirably but not essentially includes a step of resistive heating of the metal on the portion of the second surface and the metal on the portion of the substrate.

The method optionally includes a step of thinning the resonator layer following the coupling step. The thinning step includes a process chosen from the group consisting of mechanical lapping, sputtering and ion milling.

A high quality factor resonator comprising a substrate comprising a semiconductor material and including an integrated circuit and a resonator layer comprising a piezoelectric material and including a first electrode. The resonator layer is disposed on a first surface of the substrate. The resonator also includes a cavity disposed between the substrate and the resonator layer and a second electrode disposed on the substrate and on a surface of the cavity remote from the resonator layer.

DETAILED DESCRIPTION OF THE DRAWINGS

Resonators in accordance with the present invention may be formed in several types of structures. These include a via hole structure and a cavity structure. Both structures include placing a resonant structure on a surface of a substrate.

I. VIA HOLE STRUCTURE

Figure 1:
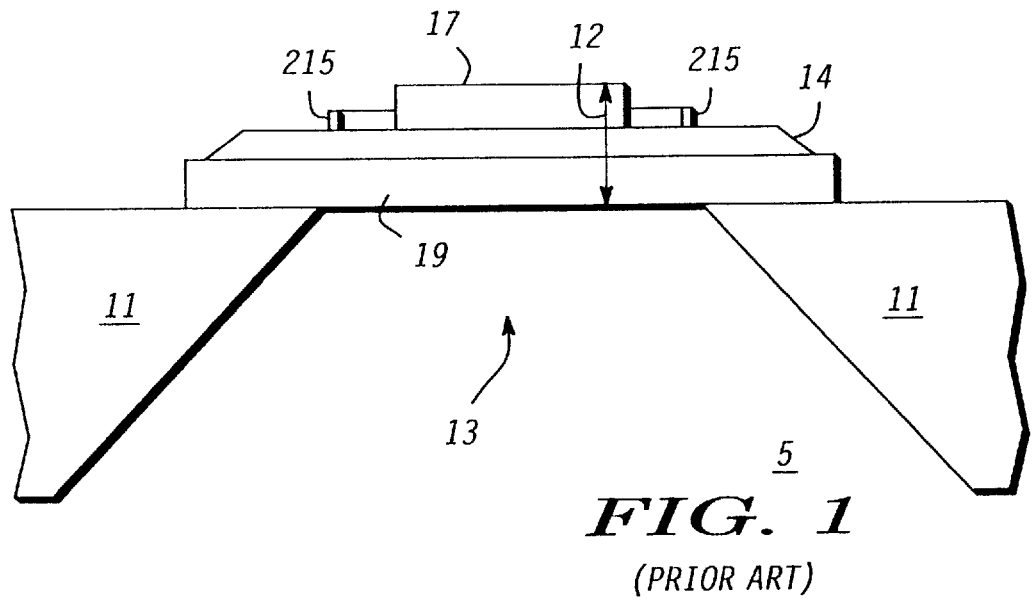
FIG. 1 illustrates a simplified side view, in section, of a thin-film acoustic resonator in accordance with the prior art.

FIG. 1 illustrates a simplified side view, in section, of acoustic resonator 5 comprising substrate 11 and piezoelectric resonator layer 14 having electrodes 17 and 19 and thickness 12 in accordance with the prior art. Thickness 12 is typically chosen to be one-half of an acoustic wavelength or an odd multiple thereof. A portion of resonator layer 14 disposed over via or cavity 13 and beneath electrode 17 provides mechanical oscillations that determine the frequency response of resonator 5.

Substrate 11 provides mechanical support for piezoelectric resonator layer 14 and electrodes 17 and 19 and for any ancillary components such as transistors, diodes, capacitors, resistors and the like included as part of a larger microelectronic device or integrated circuit (not shown). Substrate 11 conveniently comprises semiconductor material(s) or is compatible therewith (e.g., silicon on sapphire, cadmium sulphide on glass etc.). Semiconductor materials presently of particular interest include elemental semiconductors such as diamond, silicon, germanium and silicon carbide, III–V materials such as gallium arsenide, aluminum nitride, indium phosphide and the like, II–VI materials such as cadmium sulphide, zinc oxide and so forth and alloys such as, by way of example and not intended to be limiting, $Si_xGe_{1-x}$, $Al_xGa_{1-x}As$ and $In_xAl_{1-x}P$. Cubic semiconductors (e.g., Si, Ge, GaAs etc.) are often prepared as wafers having a $\{100\}$ surface, for example, which surface is polished and otherwise prepared for use as semiconductor device substrates. Other useful orientations include $\{110\}$ and $\{111\}$ faces.

An acoustic resonator such as 5 of FIG. 1 including substrate material 11 having layers 14, 17, 19 disposed thereon is etched from the back side to provide an opening 13 extending up to the bottom of the membrane comprising layers 14, 17, 19. This can be accomplished by use of etchants having etch rates sensitive to doping of semiconductor materials 11 coupled with use of a surface layer of material having different doping than the bulk of the material, for example. Other options include employing a surface layer or layers (e.g., layers 14, 17, 19) of different composition and/or crystallographic form or orientation to provide a layer following etching or other treatment to selectively remove some of material 11 immediately therebelow.

Problems encountered with this structure in some applications include or stem from (i) limitations on the availability of high Q materials in thin film form, (ii) limitations on the Q of the resonator structure due to the metallization (i.e., layers 17, 19) and (iii) limitations on the coupling coefficient of the piezoelectric materials that this structure requires.

II. CAVITY STRUCTURE

Figure 2:
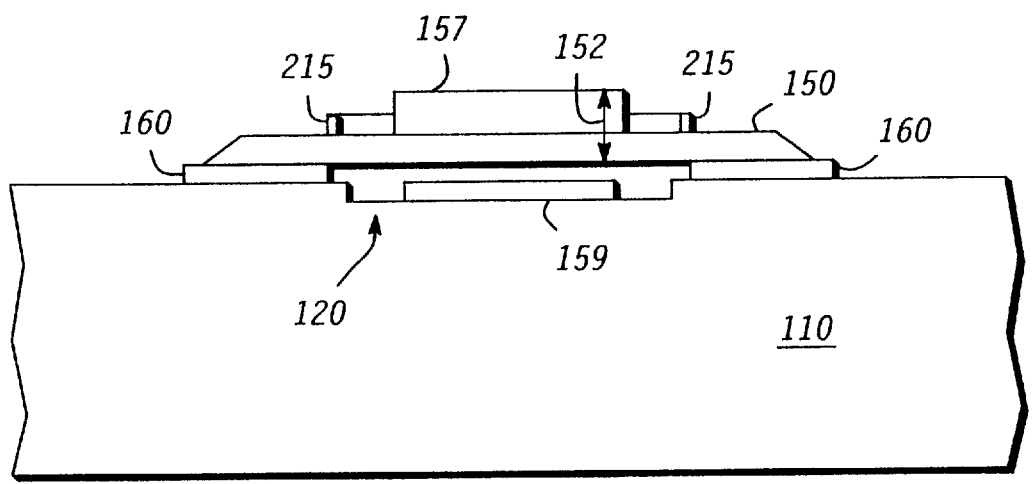
FIG. 2 illustrates a simplified side view, in section, of a first embodiment of a resonator in accordance with the present invention.

FIG. 2 illustrates a simplified side view, in section, of a first embodiment of high quality factor resonator structure 15 wherein resonator layer 150 is supported above cavity 120 in the surface of substrate 110 by thin layer of material 160. Cavity 120 also includes electrode 159 below, but not in physical contact with, resonator layer 150.

Figure 3:
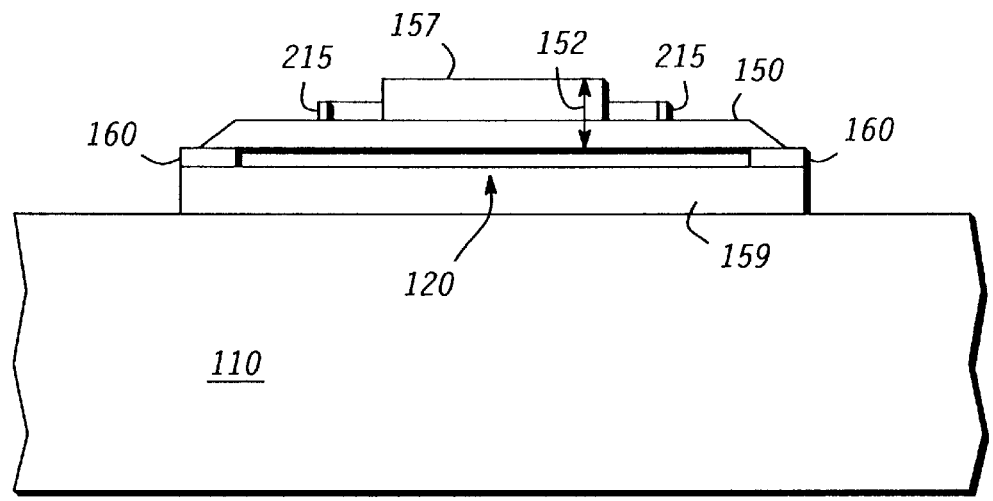
FIG. 3 illustrates a simplified side view, in section, of a second embodiment of a resonator in accordance with the present invention.

FIG. 3 illustrates a simplified side view, in section, of a second embodiment of high quality factor resonator structure 15 wherein resonator layer 150 is supported above a cavity 120 disposed above the surface of substrate 110 by a thin layer of material 160. In this case, cavity 120 is formed exclusively by layer 160.

In the structures depicted in FIGS. 2, 3, the gap separating electrode 159 from resonator layer 150 is desirably small, on the order of one-tenth or less of the thickness of resonator layer 150, but may be larger in some applications. Resonator layer 150 usefully has a thickness in a range of from less than a micrometer up to about a millimeter, desirably in a range of from less than a micrometer up to about ten micrometers and preferably in a range of from about one-half of a micrometer to about five micrometers. Thicknesses as discussed herein are measured along an axis as indicated by arrow 152. Arrow 152 also denotes the thickness of the combination of top electrode 157 and resonator layer 150. Substrate 110 is usefully a semiconductor substrate and desirably includes integrated circuitry.

Two elements of high quality factor resonator structure 15 increase the quality factor above that obtainable by prior art techniques: (i) utilizing single-crystal material for resonator layer 150 and (ii) separating resonator layer 150 from bottom electrode 159 by the small gap therebetween. In the embodiment illustrated in FIG. 3, this thickness is equal to the thickness of thin layer of material 160. The single-crystal material employed for resonator layer 150 desirably but not essentially comprises a dielectric material having a large relative permittivity ($\epsilon_r$) and also desirably comprises a piezoelectric material (e.g., $LiNbO_3$, $LiTaO_3$, lithium tetraborate and the like). The second element avoids viscous losses encountered in thin metal films at the frequencies of interest when the metal films are insonified by the resonator structure 15. Because bottom electrode 159 is not in physical contact with resonator layer 150, bottom electrode 159 may comprise materials (e.g., gold, silver etc.) that ordinarily would not be suitable for use as an electrode for exciting mechanical oscillation and/or resonance in resonator layer 150. Top electrode 157 is disposed on a distal surface of resonator layer 150, i.e., remote from substrate 110, and desirably comprises a thin (e.g., in the range of from 0.05 micrometers to several micrometers) layer of aluminum to reduce acoustic losses and mass loading effects. Typically, thinner films are employed for top electrode 157 when thinner resonator layers 150 are employed in resonator 15.

A variety of techniques applicable to acoustic resonator structures 5, 15 of FIGS. 1–4 are described in U.S. Pat. No. 4,556,812, G. R. Kline et al., "Acoustic Resonator With Al Electrodes On An AlN Layer And Using a GaAs Substrate" (Dec. 3, 1985); U.S. Pat. No. 3,313,959, J. G. Dill, "Thin-Film Resonance Device" (Apr. 11, 1967); U.S. Pat. No. 4,456,850, T. Inoue et al., "Piezoelectric Composite Thin Film Resonator" (Jun. 26, 1984); U.S. Pat. No. 4,502,932, G. R. Kline et al., "Acoustic Resonator And Method Of Making Same" (Mar. 5, 1985); U.S. Pat. No. 4,460,756, J. S. Wang et al., "Method Of Making A Piezoelectric Shear Wave Resonator" (Feb. 3, 1987); U.S. Pat. No. 4,642,508, H. Suzuki et al., "Piezoelectric Resonating Device" (Feb. 10, 1987); U.S. Pat. No. 4,719,383, J. S. Wang et al., "Piezoelectric Shear Wave Resonator And Method Of Making Same" (Jan. 12, 1988); U.S. Pat. No. 5,011,568, S. D. Brayman et al., "Use Of Sol-Gel Derived Tantalum Oxide As A Protective Coating For Etching Silicon" (Apr. 30, 1991); U.S. Pat. No. 5,075,641, R. J. Weber et al., "High Frequency Oscillator Comprising Thin Film Resonator And Active Device" (Dec. 24, 1991); U.S. Pat. No. 5,162,691, E. A. Mariani et al., "Cantilevered Air-Gap Type Thin Film Piezoelectric Resonator" (Nov. 10, 1992); and U.S. Pat. No. 5,373,268, L. N. Dworsky et al., "Thin Film Resonator Having Stacked Acoustic Reflecting Impedance Matching Layers And Method" (Dec. 13, 1994), which patents are hereby incorporated herein by reference.

III. HEATING ELEMENT

Figure 4:
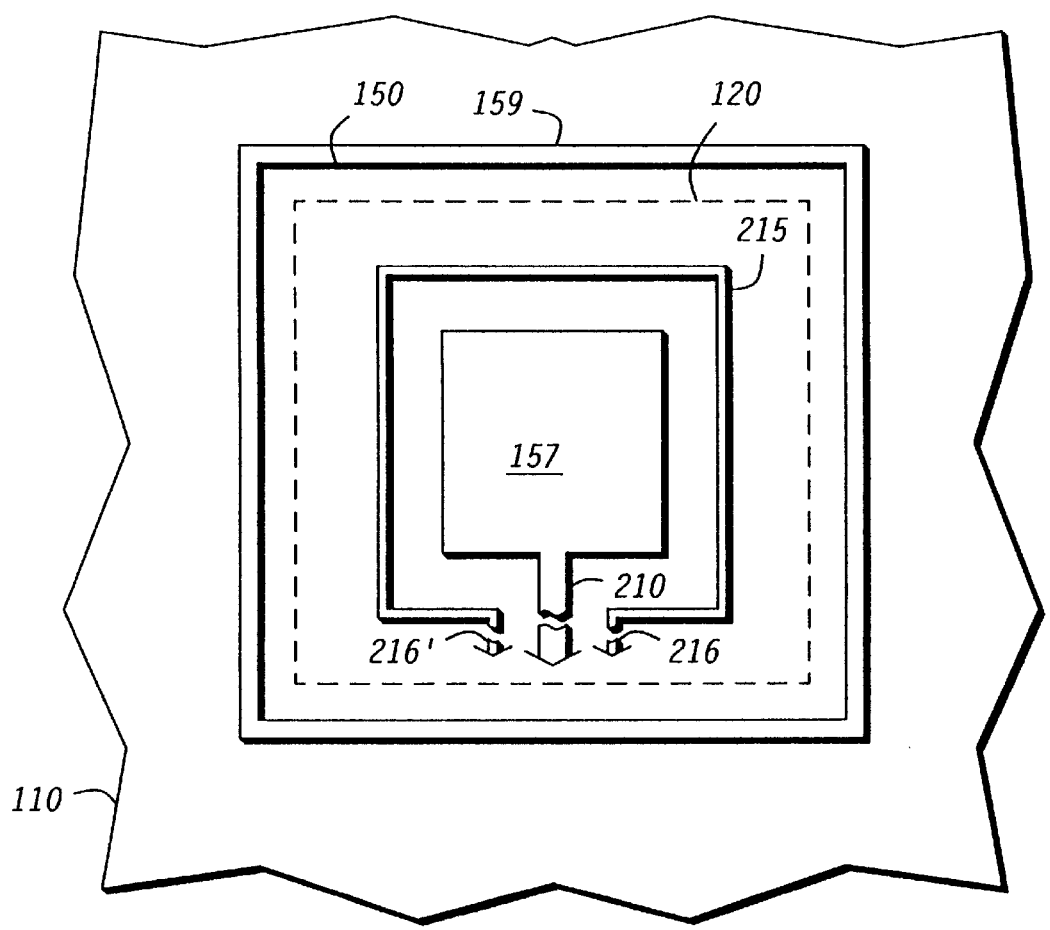
FIG. 4 illustrates a simplified plan view of a first embodiment of a temperature compensated resonator in accordance with the present invention.

FIG. 4 illustrates a simplified plan view of temperature compensated resonator 15 in accordance with the present invention. Temperature compensated resonator 15 includes electrode 157 disposed on a portion of resonator layer 150 having a periphery that is within the boundaries of via 120, shown in dotted outline in FIG. 4. Electrode 159 is illustrated as covering the entire bottom of resonator layer 150 but need only extend to cover that portion of resonator layer 150 intended to contribute to mechanical oscillation of temperature compensated acoustic resonator 15. In the example illustrated in FIG. 4, electrode 159 is also employed to mechanically affix resonator layer 150 to substrate 110 through a process, for example, of resistive heating (§ IV, infra) or thermosonic bonding (§ V, infra).

FIG. 4 also illustrates transmission line 210 having electrical connection to electrode 157 and extending from electrode 157 to external electrical circuitry (not illustrated). Transmission line 210 is constructed to have a particular characteristic impedance by varying the width of transmission line 210 and taking into account the thickness and the relative dielectric constant of resonator layer 150 and related structures in accordance with principles well known in the electromagnetic arts.

FIG. 4 further illustrates conductor 215 comprising a resistive loop having interconnections 216, 216'. Conductor 215 is heated by current (e.g., DC) introduced via interconnections 216, 216' to maintain resonator layer 150 at a desired predetermined temperature. Generally, this is done in order to reduce or avoid thermally-induced drift of the frequency response of resonator 15. Interconnections 216, 216' and transmission line 210 are routed to provide appropriate electrical connections to each, for example, by including an airbridge or other type of crossover or by making conductor 215 in the shape of a reentrant loop (not illustrated in FIG. 4).

It will be appreciated that the structures of conductor 215 illustrated in FIG. 4 may be realized by disposing the material comprising conductor 215 in other geometric shapes, e.g., in a substantially hexagonal or octagonal shape, or as a circle or the like. Similarly, the shapes of electrodes 159, 157 need not comprise squares as illustrated but may also be other polygonal or curvilinear shapes. Moreover, the shape adopted for electrode(s) 157 and/or 159 need not be the same as that of conductor 215, e.g., a square shape may be adopted for electrode 157 while a circular shape may be adopted for conductor 215. Conductor 215 is desirably formed of a material such as TiW, NiCr, Cr etc. having a thickness and linewidth to provide a desired resistance in accordance with a typical prime power requirement of 100 milliwatts in order to maintain a constant temperature over an ambient temperature range of 100° C. In the preferred embodiment, electrodes 159, 157 and conductor 215 desirably form circular shapes because these shapes reduce undesirable temperature gradients within the composite resonator structure.

IV. RESISTANCE WELDING ATTACHMENT

Attachment of resonator layer 150, especially resonator layers 150 comprising single-crystal materials such as $LiNbO_3$, $LiTaO_3$ and the like, may be effectuated via resistance welding, as described in "Fabrication of Wideband Bragg Cells Using Thermocompression Bonding and Ion Beam Milling", J. Rosenbaum et al., IEEE Trans. Son. Ultrason., Vol. SU-32, No. 1, January 1985, which article is hereby incorporated herein by reference. This article describes attachment and subsequent thinning of single-crystal, high coupling coefficient materials. The two surfaces to be bonded are metallized by vacuum evaporation to include 0.1 to 0.5 micrometers of metal, preferably silver or gold. A pressure of 2000 to 7000 $lbf/in^2$ (140 to 500 $kg/cm^2$) is applied, and a resistance check provides positive identification of samples lacking intimate contact between the two surfaces to be joined. A single current pulse (e.g., having an amplitude of tens of amperes and a duration in a range of several tens of milliseconds) is applied to heat bonding film 160 to 200° to 400° C. The specific current and duration of the pulse are chosen in accordance with the thermal properties of the materials to be joined and thermal design principles.

Following attachment, the single-crystal piezoelectric material (e.g., resonator layer 150) is mechanically lapped to a thickness of about 25 micrometers and is subsequently ion milled to a thickness in a range of one to three micrometers. Greater thicknesses may be employed for lower frequency devices.

V. ULTRASONIC WELDING ATTACHMENT

Attachment of single-crystal materials by ultrasonic welding is described in "Performance of Single-Crystal $LiNbO_3$ Transducers Operating Above 1 GHz", by N. Uchida et al., IEEE Trans. Son. Ultrason., Vol. SU-20, No. 3, July 1973 or "Ultrasonically Welded Piezoelectric Transducers", by J. D. Larson III et al., IEEE Trans. Son. Ultrason. Vol. SU-18, No. 3, July 1971, which articles are incorporated herein by reference. These articles describe mounting of single-crystal materials having thicknesses in a range of more than one millimeter to about one hundred micrometers (with subsequent mechanical polishing to reduce the thickness to about six to ten micrometers) using pressures in a range of from 2000 to 4000 $lb/in^2$ (140 to 280 $kg/cm^2$), acoustic powers of less than a watt (18 kHz), temperatures in a range of from 250° to 400° C. and times of from 15 to 120 minutes (Larson et al.) or pressures in a range of 120 $kg/cm^2$, a few watts of ultrasonic energy (15 kHz), temperatures of about 300° C. and a time of about 90 minutes (Uchida et al.).

Subsequent thinning of the mounted resonator may be effected by sputtering as described by Uchida et al. or Larson et al.

VI. EXAMPLE I

An example of a resonator design is summarized below and compared to a conventional design in Table I. The new design has about one-half the motional capacitance but about three-fourths the static capacitance of a conventional design, about one-third more resonance equivalent capacitance, slightly less than twice the radiation resistance and about twice the motional inductance of the conventional design. These values suggest that different impedance inverter circuitry may be required in order to employ the new design to greatest advantage.

TABLE I

|  | Cm 10-3 pF | Lm nH | Rm Ω | Co pF | Cr pF |
|---|---|---|---|---|---|
| Conventional | 8.88 | 1099 | 0.356 | 1.365 | 152.7 |
| New Design | 4.925 | 1978 | 0.6408 | 1.0107 | 204.8 |

Modeled characteristics of $LiNbO_3$ resonators having an area of 4.5 × 10-8 $m^2$, Cs =3.969 pF, where the new design incorporates an air gap of 0.1 micrometer between one electrode and the crystal.

VII. EXAMPLE II

A series of calculations were made of $C_o$ (static capacitance, given in Pf), $C_m$ (motional capacitance in $10^{-3}$ pF), $R_m$ (motional resistance), $L_m$ (motional inductance in nanohenrys), fs (zero frequency in gigahertz), fp (pole frequency in gigahertz), Qu (unloaded Q) and Cr (capacitance ratio) for $LiNbO_3$ resonators having a thickness d of circa 11.45 micrometers (operating at the $N=5^{TH}$ harmonic) and an area (of electrode 157) of $4.5 \cdot 10^{-8}$ $m^2$ for different configurations. These values are summarized in Table II below.

TABLE II

|  | 1 | 2 | 3 | 4 | 5 |
|---|---|---|---|---|---|
| $C_o$ | 1.356 | 1.356 | 1.356 | 1.356 | 1.3789 |
| $C_m$ | 8.88 | 8.75 | 8.87 | 7.93 | 8.99 |
| $R_m$ | 0.356 | 0.537 | 0.443 | 2.1785 | 0.438 |
| $L_m$ | 1099 | 1163 | 1123 | 1332 | 1080 |
| fs | 1.6104 | 1.57704 | 1.59355 | 1.54843 | 1.61448 |
| fp | 1.6157 | 1.58213 | 1.59877 | 1.55295 | 1.61977 |
| Qu | 31237 | 21453 | 25417 | 5951 | 25008 |
| Cr | 153 | 155 | 153 | 171 | 153 |

Representative values for four different resonator configurations illustrating effect of number of electrodes and choice of electrode material on impedance characteristics.
1 = no electrodes;
2 = 0.2 μm Al electrodes each side;
3 = 0.1 μm Al electrodes each side;
4 = 0.1 μm Al on one side, 0.1 μm Au on the other;
5 = 0.1 μm Al electrodes on both sides;
1–4, d = 1.45 micrometers;
5, d = 11.3 micrometers.

The results summarized in Table II show that the unloaded Q is grossly reduced by use of a gold electrode (example 4) and that adding any metal reduces the unloaded Q (compare example 1 to the others). The gold electrode also shows the greatest reduction in frequency.

VIII. CONCLUSION

Thus, a high Q resonator 15 has been described which overcomes specific problems and accomplishes certain advantages relative to prior art methods and mechanisms. The improvements over known technology are significant. The expense, complexities and high weight, size and power requirements of prior art approaches are avoided. Resonator 15 having a thin gap between resonator layer 150 and second electrode 159 may be usefully combined to form filters and oscillators that are manufacturable and are robust in operation, and may be combined with monolithic integrated circuitry to provide signal processing modules that are extremely compact.

Moreover, in alternative embodiments (not illustrated), conductor 215 (FIG. 4) may be formed on substrate 110 or may comprise a suitably-doped and shaped region within substrate 110. These embodiments are not as efficient in heating resonator layer 150 but have the advantage of requiring less lithography to be performed on resonator layer 150. Alternatively, conductor 215 may be configured as a single strip along one or more sides of electrode 157. This arrangement simplifies layout etc. but also introduces undesirable temperature gradients within resonator layer 150.

It will so be appreciated that separating bottom electrode 159 from resonator layer 150 allows conductor 215 (e.g., a loop surrounding the region occupied by electrode 157) that is deposited on resonator layer 150 to be included on the lower surface thereof, obviating need for crossovers or other structures that obtains when electrode 157 is disposed on the same surface of resonator layer 150 as is conductor 215.

It will be appreciated that either of the welding techniques described may be employed with either of the gas-phase etching processes described for thinning resonator layer 150 or that other bonding or thinning processes may be usefully applied for manufacturing acoustic resonator 15.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

I claim:

1. A method for manufacturing a high quality factor resonator, said method comprising steps of:

providing a substrate;

providing a resonator layer having substantially parallel first and second surfaces first and second electrodes associated with said first and second surfaces, respectively; and coupling said resonator layer to said substrate such that said resonator layer is disposed atop said substrate and including a cavity disposed between said second surface of said resonator layer and said substrate, said coupling step including a step of providing said second electrode contained with said cavity, said second electrode disposed parallel to said second surface and separated therefrom by a gap having a width in a range of from 0.05 micrometers to about one micrometer.

2. A method as claimed in claim 1, further comprising a step of disposing said first electrode having a periphery on said first surface of said resonator layer, wherein said periphery is disposed over said cavity and within a periphery of said cavity and said first surface is more remote from said substrate than said second surface.

3. A method as claimed in claim 1, wherein said step of providing a substrate includes a step of providing a semiconductor substrate including integrated circuitry.

4. A method as claimed in claim 1, wherein said step of providing a resonator layer includes a step of providing a resonator layer comprising single-crystal material.

5. A method as claimed in claim 4, wherein said step of providing a resonator layer includes a step of providing a resonator layer comprising material chosen from the group consisting of lithium niobate, lithium tantalate and lithium tetraborate.

6. A method as claimed in claim 1, wherein said step of coupling includes steps of:

disposing metal on a portion of said second surface of said resonator layer;

disposing metal on a portion of said substrate;

aligning said metal on said portion of said second surface with said metal on said portion of said substrate; and welding said resonator layer to said substrate.

7. A method as claimed in claim 6, wherein said welding step includes a step of welding by resistive heating of said metal on said portion of said second surface and said metal on said portion of said substrate.

8. A method as claimed in claim 1, further including a step of thinning said resonator layer following said coupling step, wherein said thinning step includes a process chosen from the group consisting of mechanical lapping, sputtering and ion milling.

9. A method for manufacturing a high quality factor resonator, and a high quality factor resonator manufactured by said method, said method comprising steps of:

providing a substrate;

providing a resonator layer having substantially parallel first and second surfaces;

coupling said resonator layer to said substrate such that said resonator layer is disposed atop said substrate and including a cavity disposed between said second surface of said resonator layer and said substrate;

disposing a first electrode having a periphery on said first surface of said resonator layer, wherein said periphery is disposed over said cavity and within a periphery of said cavity and said first surface is more remote from said substrate than said second surface; and providing a second electrode contained within said cavity, said second electrode disposed parallel to said second surface and separated therefrom by a gap having a width in a range of from 0.05 micrometers to about one micrometer.

\* \* \* \* \*